(12) United States Patent
Wang

(10) Patent No.: US 8,890,287 B2
(45) Date of Patent: Nov. 18, 2014

(54) INTEGRATED NANO-FARAD CAPACITORS AND METHOD OF FORMATION

(75) Inventor: James Jen-Ho Wang, Phoenix, AZ (US)

(73) Assignee: Power Gold LLC, Phoenix, AZ (US)

( * ) Notice: Subject to any disclaimer, the term of this patent is extended or adjusted under 35 U.S.C. 154(b) by 159 days.

(21) Appl. No.: 12/802,012

(22) Filed: May 27, 2010

(65) Prior Publication Data
US 2010/0301452 A1    Dec. 2, 2010

Related U.S. Application Data

(60) Provisional application No. 61/217,233, filed on May 29, 2009.

(51) Int. Cl.
  *H01L 29/92* (2006.01)
  *H01L 21/02* (2006.01)
  *H01L 23/522* (2006.01)
  *H01L 49/02* (2006.01)
(52) U.S. Cl.
  CPC ............ *H01L 23/5223* (2013.01); *H01L 28/60* (2013.01); *H01L 2924/09701* (2013.01)
  USPC ...................................................... 257/532
(58) Field of Classification Search
  CPC ............... H01L 27/0805; H01L 27/0808; H01L 27/0811; H01L 27/0814; H01L 27/0817; H01L 27/1082; H01L 27/10823; H01L 28/40; H01L 28/55; H01L 28/56; H01L 28/57; H01L 28/60; H01L 28/65; H01L 28/75
  USPC .......................... 257/295–310, 532, E21.008
  See application file for complete search history.

(56) References Cited

U.S. PATENT DOCUMENTS

| | | | |
|---|---|---|---|
| 3,201,667 A | 8/1965 | Varga | |
| 3,330,697 A | 7/1967 | Pechini | |
| 4,451,845 A | 5/1984 | Philofsky et al. | |
| 5,046,043 A | 9/1991 | Miller et al. | |
| 5,401,680 A | 3/1995 | Abt et al. | |
| 5,656,834 A | 8/1997 | Grzyb et al. | |
| 6,190,993 B1 | 2/2001 | Seo et al. | |
| 6,660,610 B2 * | 12/2003 | Robinson | 257/E21.008 |
| 7,602,068 B2 * | 10/2009 | Coolbaugh et al. | 257/773 |
| 2006/0022245 A1 * | 2/2006 | Jeong et al. | 257/296 |
| 2008/0081431 A1 * | 4/2008 | Roh et al. | 257/E21.011 |
| 2009/0134493 A1 * | 5/2009 | Iwaki | 257/532 |

* cited by examiner

*Primary Examiner* — Cuong Q Nguyen
(74) *Attorney, Agent, or Firm* — Schmeiser, Olsen & Watts LLP

(57) ABSTRACT

A high value capacitance per unit area capacitor is fabricated on a substrate 1 by converting a portion of a primary function anti-reflecting conducting layer 36 to a high value dielectric layer 37 by partially oxidizing the conducting layer to form the dielectric layer. The resultant combination is sandwiched between two metal layer electrodes 35 and 55 to complete the capacitor structure.

7 Claims, 4 Drawing Sheets

INTEGRATED NANO-FARAD CAPACITORS AND METHOD OF FORMATION

The following patent application is based upon and claims priority from provisional patent application number U.S. 61/217,233 filed May 29, 2009.

BACKGROUND OF THE INVENTION

The present invention relates generally to semiconductor components, and more particularly to the formation of integrated circuit capacitors, and even more particularly to the formation of high capacitance value integrated circuit capacitors.

In the past, standard methods employed to integrate capacitive structures within integrated circuits included a sandwich of silicon, thin-oxide, and polysilicon. It is known in the art that the value of capacitance per unit area increases with thinner dielectric film or with higher dielectric constant material. Therefore, nanometer thin silicon oxide, silicon nitride, oxi-nitride or ferroelectric dielectric material is typically deployed to form capacitors. Dielectric oxides formed with silicon have low dielectric constants of 3.9. The resultant capacitors are limited to pico-Farad or smaller values due to the low value dielectric constant creating a low value capacitance per unit area and correspondingly limited due to size restrictions, i.e., "silicon real estate", for the total area of the integrated circuit layout configuration.

Efforts to increase capacitance by further thinning the dielectric layer are constrained due voltage breakdown characteristics of the dielectric layer. Enlarging the area of a capacitor to increase the total capacitance often creates reliability issues due to photomask defect density characteristics creating pinholes in the dielectric layers of the capacitors. Therefore, realistic expectations for maximum capacitance values using present art technology are in the range of five to ten pico-Farads. The total number of capacitors per integrated circuit die is also limited by the physical size of the capacitors.

Typically, larger value capacitors required for circuits are incorporated externally, to the integrated circuit, as discrete capacitors.

Efforts to increase integrated circuit "real estate" efficiency have been investigated, including the formation of capacitors between metal lines or between layers of interconnect metal. However, these methods are not easily implemented due to the effects of parasitic capacitances between interconnect metals. Therefore, formation of integrated capacitors within integrated circuits is generally incorporated between the semiconducting surface and the first metal lines.

Furthermore, thick inter-layer dielectric and low-k dielectric films are intentionally employed to reduce unwanted parasitic capacitances between interconnect metal layers and between metal lines having narrow spacing within same metal layer. The resultant effect negatively impacts the maximum capacitance per unit area that can be achieved.

Additional methods for increasing the relative per unit area capacitance include the creation of vertically integrated capacitor structures. However, the resulting wafer process is more complex and more costly than standard processed wafers with laterally integrated components.

Therefore, what is needed is a cost effective method of providing larger per unit capacitance values, i.e., in the nano-range, incorporated in a standard integrated circuit wafer process.

SUMMARY OF THE INVENTION

Electronic products require many capacitor components that are typically discrete components, peripherally surface mounted onto printed circuit boards and adjacent to their corresponding integrated circuits. The assimilation of discrete capacitors into semiconductors and integrated circuits is desired to subsequently shrink board size and to further reduce cost.

The present invention describes a method for fabricating higher value, e.g., nano-Farad capacitors, by forming a structure of titanium oxide dielectric sandwiched between two lateral metal layers.

A thin titanium nitride (TiN) compound anti-reflective coating (ARC) is commonly applied to an integrated circuit wafer to use as an aid for optical lithography for patterning and etching narrow aluminum lines. A TiN film residual remains on the aluminum lines and is typically covered by interlayer dielectric (ILD) or by final passivation.

In the inventive process, TiN, is uncovered and oxidized into a high dielectric constant, titanium oxide. The thick ILD or passivation film covering over ARC layer is etched over the region where capacitors are to be formed. The invention exemplifies a method for oxidizing the titanium nitride film, and reusing the oxidized film to create high value integrated capacitors between metal layers on integrated circuits or alternatively, miniature integrated passive devices (IPD).

Accordingly, it is the object of the present invention to provide a method for fabricating larger value per unit area integrated circuit capacitors.

It is another object of the present invention to integrate large value capacitors using cost effective processes.

It is still another object of the invention to minimize the number of additional process required to integrate the larger per unit value capacitance.

DETAILED DESCRIPTION OF THE DRAWINGS

For simplicity and clarity, integrated active and passive components other than the inventive higher value capacitors, are not illustrated in the foregoing descriptions. However, one skilled in the art would recognize that integrated components, e.g., resistors, transistors, inductors, low value capacitors, etc., and multiple layers of interconnect metal can be integrated along with the inventive higher value capacitor process.

Figure 1:
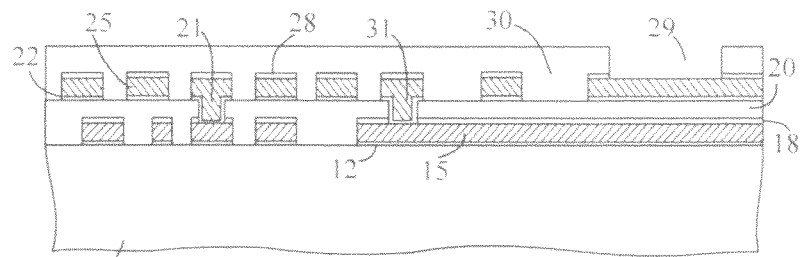
FIG. 1 illustrates a cross-sectional view of prior art formation of integrated capacitors.

Looking now to FIG. 1 a cross-sectional view of a semiconductor device of present art utilizing titanium nitride (TiN) integration is shown. In FIG. 1, interconnect metal layer 15 is formed above Ti/TiN adhesion layer 12 and underneath TiN anti-reflecting coating (ARC) 18. Likewise, interconnect layer 25 is formed atop Ti/TiN adhesion coating 22 and beneath ARC layer 28. Interlayer dielectric (ILD) oxide layer 20 is used to separate the two interconnect metal layers. The ILD layer is typically silicon oxide or some other low dielectric film. The dielectric film is purposely chosen with a low dielectric constant to minimize stray, parasitic capacitances between the metal interconnect layers.

Passivation layer 30 is an oxide-nitride layer that resides atop the top interconnect metallization layer. Vias 21 and 31 allow electrical contacts to lower interconnect layer 15 where the ARC layer 18 at via contacts had been etched away to reduce via contact resistances. ARC layer 28 is etched away at passivation opening 29 to expose bare aluminum required for probing and wire bonding. Residuals of ARC layers 18 and 28 are covered by the ILD or by passivation and remain as conductive TiN films.

Figure 2:
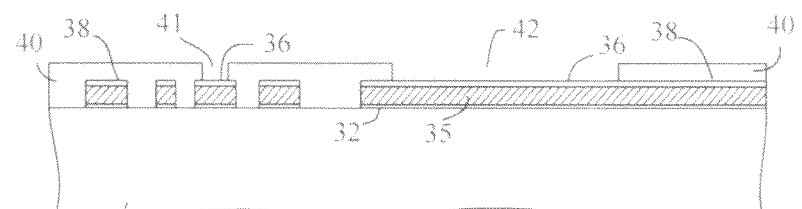
FIG. 2 illustrates a cross-sectional view of the present invention showing structures of interconnect aluminum metal with Ti/TiN layers after ILD etch.

Referring now to FIG. 2, a cross-section of an embodiment of the integrated wafer of the present invention is shown. In FIG. 2, substrate 1 is suitable for configuring integrated components, both active and passive. To provide clarity, the integrated components are not shown. The integrated components are, but are not limited to transistors, diodes, capacitors, resistors, and inductors. Substrate 1 is, but is not limited to, silicon, germanium, SiGe, GaN, GaAs, SOI, glass, and other compound semiconductors for integrated alternatives. Alternatively, the present invention can be applied to the field of discrete component applications using, for example, surface mounted components. For such discrete type applications, substrates are, but are not limited to ceramic, flexible organic substrates, and printed circuit board materials.

Adhesion/barrier layer 32 is patterned correspondingly to first metal layer 35 and sputtered, for example, to a thickness of less than 200 nanometers, Adhesion/barrier 32 is, but is not limited to, compounds of Ti/TiN, TiN, TaN, and TiW. First metal layer 35 serves as interconnect to respective components (not shown) and as the bottom electrode in the desired capacitor area. Interconnect metal 35 is, but not limited to, Al, Cu, Ag.

Anti-reflecting (ARC) coating layer 38 is patterned coincidentally to first metal layer 35 and sputtered, typically, in a thickness range from 20 to 200 nanometers. The ARC layer functions to reduce reflections from corresponding metal layers during photolithography processes. The ARC layer is, but is not limited to,compounds of TiN, TiN containing Ba, Sr, Ca, Mg, or TaN. Further increases in thickness of the ARC layer are used to accommodate higher dielectric breakdown voltages. ARC layer 38 is purposely made thicker than ARC layer 18 of FIG. 1 to facilitate fabrication of capacitors with high capacitance values. ARC layer 18 is solely used for anti-reflecting properties and is typically thinner, for example, 20 nanometers, than the inventive use of ARC layer 38.

Although the primary function of the ARC layer is to prevent reflections during the photolithography process, one skilled in the art would recognize the ARC layer may be alternatively selectively patterned to serve as a process component in fabrication of the inventive capacitor.

Referring again to FIG. 2, interlayer dielectric layer (ILD) 40 is deposited atop the structure. The ILD layer is, but is not limited to low k dielectric constant materials such as silicon dioxide and doped oxides. A photomask step patterns capacitor opening 42 and contact via opening 41 on the ILD layer. The ILD layer is then dry etched down to the surface of the ARC layer, creating exposed TiN ARC layer areas 36 for the respective via openings and capacitor openings.

Figure 3:
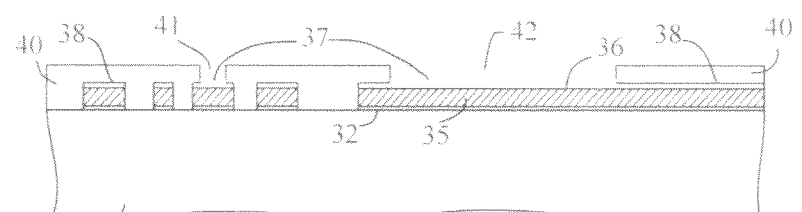
FIG. 3 illustrates a cross-sectional view of the present invention with oxidation of the conductive TiN ARC layer to form dielectric TiOx.

Referring now to FIG. 3, the exposed top surface of ARC layer 36 at interlayer dielectric via contact opening 41 and capacitor opening 42 is oxidized to convert a portion of the ARC TiN compound layer into titanium oxide layer 37, a dielectric layer. The method of oxidation is but is not limited to, thermal oxidation in an oven or plasma assisted oxidation in a plasma chamber. The atmosphere of thermal oven is, but is not limited to, a combination of nitrogen, oxygen and water in form of gaseous vapor. Moisture is added to accelerate the oxidation rate of titanium nitride at lower temperatures from 250 to 500 degrees Celsius. Inert gas is added during oven ramp up, oxidation, and oven ramp down to dilute, i.e., slow down the oxidation rate, to limit oxidation, and to anneal. The inert gas is, but is not limited to, nitrogen or argon. For example, after 200 degrees centigrade, the surface of the TiN compound layer is partially oxidized in $O_2$. The resulting stoichiometric state and amorphous structure generated at the surface of the ARC layer is TiOx. As one skilled in the art would recognize, multiple stoichiometric states and crystalline structures are possible, including, but not limited to $TiO_2$, $Ti_2O_3$ $Ti_3O$, and $Ti_2O$, each state exhibiting unique material characteristics and different dielectric constant.

The thickness of the resulting titanium oxide layer (TiOx) is controlled by a combination of oxidation temperature, time, gas mixture and gas pressure such that a partial thickness of ARC layer 36 is oxidized to create uniform titanium oxide 37 over ARC 36. Post oxidation anneal, for example at hotter temperatures, in nitrogen or other gases known in the art, stabilizes and optimizes the dielectric film properties of titanium oxide layer 37.

Figure 5:
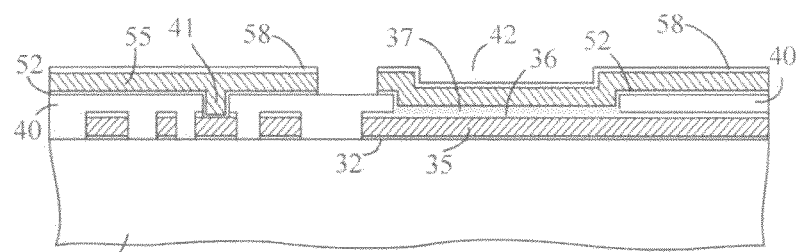
FIG. 5 illustrates a cross-sectional view of the present invention with deposition of next interconnect aluminum layers and capacitor.

Referring to FIG. 5, adhesion/barrier layer 52 is patterned, sputtered, for example, to a thickness of less than 20 nanometers. Adhesion/barrier 52 is, but is not limited to, compounds of Ti/TiN, TiN, TaN, and TiW. Second metal layer 55 is patterned coincidentally with the adhesion/barrier layer and serves as a routing layer, interconnect to first layer metal 35 through via 41, and also serves as the top electrode in capacitor area 42. Interconnect metal 55 is, but not limited to, Al, Cu, Ag.

Surface TiOx thickness grows with oxidation while underlying TiN film is consumed. One skilled in the art would recognize conductive TiN ARC layer 36 remaining residually after oxidation is less important and some excess TiN is useful to widen manufacturing process windows. Alternatively, the entire ARC thickness in the capacitor opening is oxidized and converted completely to TiOx Alternatively, one skilled in the art would recognize other ARC films, for example, TaN, are oxidized to form, a partial Ta-oxide layer.

Figure 4:
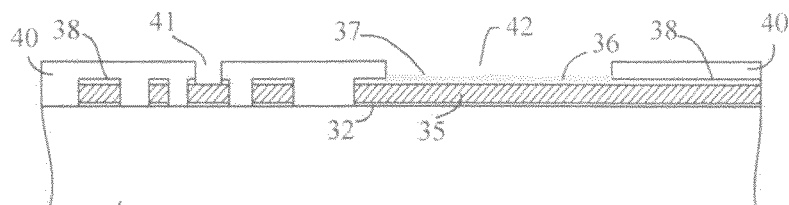
FIG. 4 illustrates a cross-sectional view of the present invention with patterning and etching of titanium oxide plus TiN at via and unetched capacitor area.

Looking at FIG. 4 A second via photolithographic patterning and oxide etch is implemented after the oxidation of ARC layer 36 to selectively remove insulating titanium oxide over via contact opening 41 while not etching oxidized ARC layer 37 in capacitor opening 42. The second via photolithographic pattern and etch also helps to slope the interlayer dielectric sidewall profile of contact vias. Alternatively, the second via photolithographic patterning and ARC etch occurs prior to the patterning of the capacitor opening and corresponding ARC oxidation to achieve similar results to the aforementioned process Optionally, one skilled in the art would recognize that laser methods of selective abrasion are equivalent to the photolithographic patterning and etching steps previously noted.

Referring to FIG. 5, adhesion/barrier layer 52 is patterned, sputtered, for example, to a thickness of less than 20 nanometers. Adhesion/barrier 52 is, but is not limited to, Ti/TiN, TiN, TaN, and TiW. Second metal layer 55 is patterned coincidentally with the adhesion/barrier layer and serves as a routing layer, interconnect to first layer metal 35 through via 41, and also serves as the top electrode in capacitor area 42. Interconnect metal 55 is, but not limited to, Al, Cu, Ag.

Anti-reflecting (ARC) coating layer 58 is patterned coincidentally to second metal layer 55, sputtered, typically, in a thickness range of 20 to 200 nanometers, and etched. The ARC layer is, but is not limited to, compounds of TiN, TiN containing Ba, Sr, Ca, Mg, or TaN.

Although the ARC layer is typically not placed on top of copper interconnects, an alloy conducting layer composing of Ti/TiN may be deposited over copper after a chemical mechanical polishing (CMP) for the purpose of creating titanium oxide capacitors with copper electrodes. In the case of CMP copper flow, interlayer dielectric etching must be selectively controlled to control the titanium oxide dielectric thickness of capacitors.

Titanium oxide layer 37 is the capacitor dielectric sandwiched between the two TiN layers 52 and 36, and further sandwiched between first and second interconnect metals 55 and 35, to form a metal-oxide-metal capacitor. Thick interlayer dielectric layer (ILD) 40 separates all other interconnect metals to maintain low parasitic capacitances.

Drawn and illustrated in FIG. 5 is a planar 2-dimensional metal-oxide-metal capacitor. Other technologies utilize trench or vertical 3D topography in order to increase the surface area and thereby increase capacitance values. Given the present invention, those skilled in the art can realize that vertical, trench technology, and/or 3D capacitors alternatively are created where trenches are filled with doped polysilicon, partially oxidized TiN/TiOx, aluminum, and/or copper. The vertical topography further increases the capacitance value per unit of silicon surface area.

In FIGS. 6, 7, 8, and 9, a second metal-oxide-metal capacitor is fabricated between the second metal interconnect layer and a post passivation metal system, for example power gold metallization.

Figure 6:
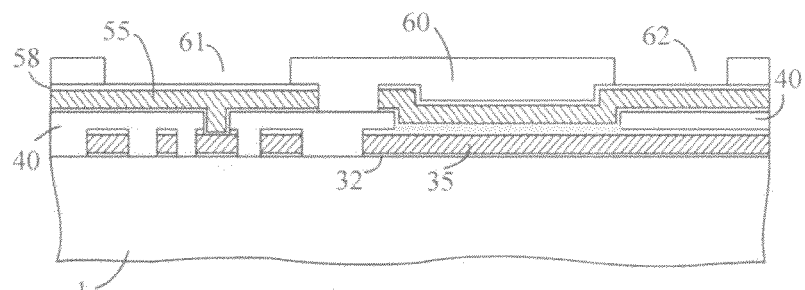
FIG. 6 illustrates a cross-sectional view of the present invention with deposition and etch of passivation film.

In FIG. 6, passivation 60 covers interconnect metal layer 55. Passivation photolithography and etch forms two openings through the passivation; i.e., capacitor opening 61 and probe or wire bond contact via opening 62.

Figure 7:
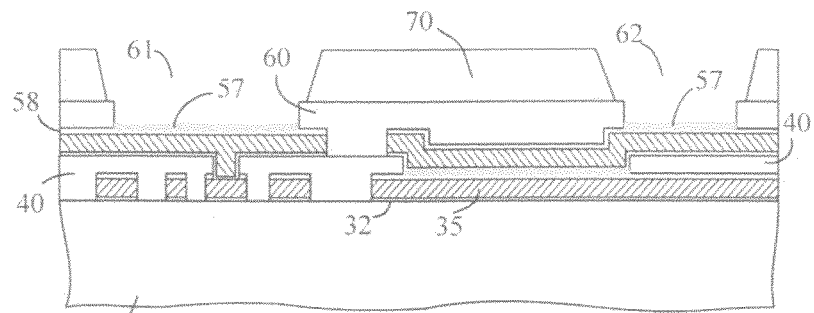
FIG. 7 illustrates a cross-sectional view of the present invention with patterning of the polyimide film and partial oxidation of TiN and formation of TiOx.

In FIG. 7, polyimide film 70 is patterned and cured on the structure of FIG. 6, creating concurrent openings through the polyimide coinciding with capacitor opening 61 and contact via opening 62. The polyimide is typically baked at 350C. The baking process includes oxidizing, moist and/or inert gases, as described previously in the thermal oxidation process, to also partially oxidize and anneal ARC layer 58 to form oxidized titanium oxide/ARC layer 57 in both the capacitor and contact via openings, and then to dehydrate polyimide 70.

Figure 8:
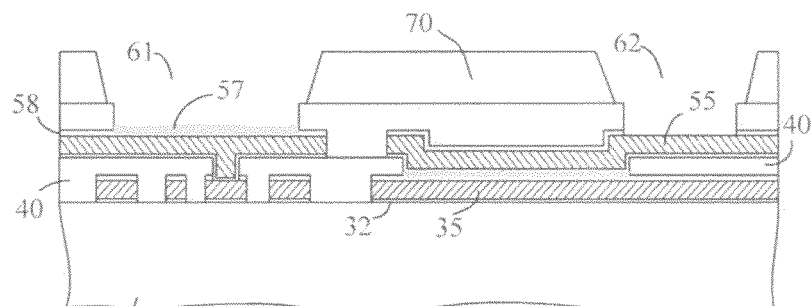
FIG. 8 illustrates a cross-sectional view of the present invention with patterning and etching of TiOx and Ti/TiN at contact via and unetched capacitor area.

In FIG. 8, another passivation photolithography (not shown) is patterned to mask capacitor opening 61 and to permit etching of titanium oxide plus TiN layers over probe and bond contact via pad 62, creating a contact path for second metal layer 55.

Figure 9:
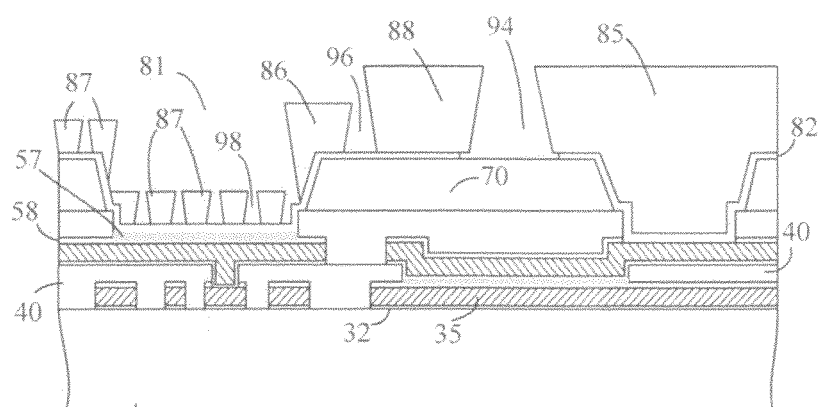
FIG. 9 illustrates a cross-sectional view of the present invention with deposition of thick power metal film.

FIG. 9 shows an over passivation power metal layer interconnect system added to FIG. 8. Seed metal 82 is sputtered across the top surface of the wafer to provide a conducting electrode for building a thick metal Power Gold interconnect system. Lithography photoresist is patterned over the seed metal to permit electroplating of thick metal areas, i.e., 85, mid-size thick metal 86, narrow-thick metal capacitor interconnect 87, and wide thick metal pad 88. Thick metal capacitor metal interconnect 87 is purposely segmented to provide stress relief in capacitor area 81.

Next, the thick metal is deposited in the patterned areas through electroplating. The resulting thickness of the thick metal is related to the size of lithographic openings. The photoresist layer is then removed.

Next, the seed metal is selectively removed through a wet etching process. In normal to wide space 94, the width of the space is sufficient to permit the etchant to completely remove the seed metal. In narrow spaces 98, and in mid-width spacing 96, the width of the spacing is narrow and inhibits the wet etchant from completely removing seed layer 82. Thus, the residual seed metal provides continuous electrical contact of narrow thick metal 87 to the mid-size thick metal 86 and to the normal wide thick metal 88.

Thick metal is, but is not limited to, gold, copper, Cu/Ni/Pd, Cu/Ni/Au, Ni/Au, Ag. Seed metal is, but is not limited to, TiW, TiWN, and Cr. Examples for thick metal copper metallization processes are found in U.S. Pat. No. 6,646,347.

Figure 10:
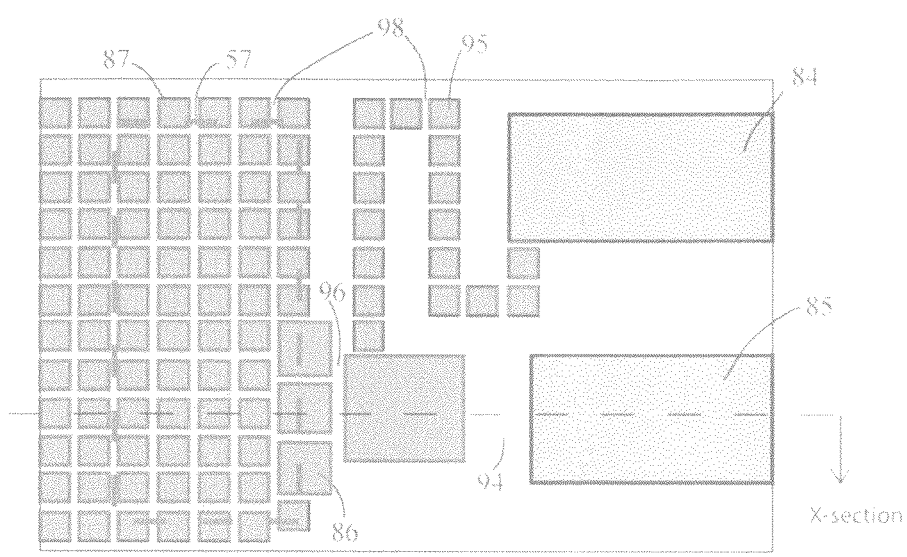
FIG. 10 illustrates a topological view of capacitor, thick metal resistor and contact/probe pad regions with cross-section referenced to FIG. 9.

FIG. 10 is a topological view of the embodiment of FIG. 9, with the accompanying cross-sectional representation (dashed line). Also shown is integrated capacitor area 81 connected by a thick metal resistor and interconnect 95 to the thick metal wire bond pad 84.

Thus it can now be appreciated that the present invention provides a method for fabricating a high value per unit area capacitor by converting a portion of a single function conducting layer to a secondary function, by partially oxidizing the primary function anti-reflecting conducting layer to form a secondary function dielectric layer with a large value dielectric, and further sandwiching the resultant combination between two electrodes to complete the capacitor structure.

It can be further appreciated that the multiple stoichiometric states for the inventive dielectric permits a wide range of process adjustment for establishing per unit area capacitance.

It can be even further appreciated that the present invention provides a capacitor with a per unit area capacitance that is four to thirty times greater than standard silicon dioxide technology.

It can be even more so appreciated that the present invention provides a cost effective implementation for fabricating high value capacitors with minimal additions to existing wafer process steps. It can be still further appreciated that the present invention is applicable to integrated trench technology.

It can also be appreciated that the present invention is applicable to fabrication of high value per unit area capacitors on varying substrates, e.g., printed circuit board materials, ceramics, and glass.

It can also be more appreciated that the present invention is applicable to fabricating miniaturized discrete components.

In the foregoing specification, the invention has been described with reference to specific embodiments and to specific materials and to specific process steps. It is recognized that many more steps in photolithography, exposure, develop, metal deposition, etches, bake, anneal, etc. are required to form a complete semiconductor flow and method. These steps are known to skilled artisans and therefore are not mentioned in order to reduce the number of steps and to simplify drawings and to provide clarity. Variation in process flow is possible and still achieves similar results. For example, the ARC layer can be completely oxidized to convert all of the TiN compound, in the capacitor area, into titanium oxide dielectric as a variation of the invention. Additionally if more than 2 layers of interconnect metal layers are available, metal-oxide-metal capacitors may be created between 2, 3, 4 or as many or as few metal layers as needed (repeating wafer processes) to stack capacitors. Additionally, the capacitor structure may be fabricated with intervening layers between the substrate and the capacitor structure.

While specific embodiments of the present invention have been shown and described, further modifications and improvements will occur to those skilled in the art. It is understood that the invention is not limited to the particular forms shown, and it is intended for the appended claims to cover all modifications that do not depart from the spirit and the scope of this invention.

I claim:

1. A semiconductor integrated capacitor, comprising:
    a substrate configured for fabricating the integrated capacitor;
    a first capacitor electrode formed on the substrate;
    a second capacitor electrode;
    a metal nitride conductive layer formed on the upper surface of the first capacitor electrode; and
    an oxidized dielectric layer adjacent to and derived proportionately from said metal nitride conductive layer, said oxidized dielectric layer and said metal nitride conductive layer residing between said first and second capacitor electrodes, wherein said metal nitride conductive layer is formed on the entire upper surface of the first capacitor electrode, and further comprising a dielectric layer formed on an upper surface of the metal nitride conductive layer and having at least one opening exposing a portion of the upper surface of the metal nitride layer, wherein said oxidized dielectric layer is adjacent to the at least one opening.

2. The semiconductor integrated capacitor of claim 1, wherein said metal nitride conductive layer is TiN.

3. The semiconductor integrated capacitor of claim 1, wherein said metal nitride conductive layer is TaN.

4. The semiconductor integrated capacitor of claim 2, wherein said metal nitride conductive layer contains at least one of Ba, Sr, Ca or Mg.

5. The semiconductor integrated capacitor of claim 3, wherein said metal nitride conductive layer contains at least one of Ba, Sr, Ca or Mg.

6. The semiconductor integrated capacitor of claim 2 wherein said oxidized dielectric layer is oxidized TiO2.

7. The semiconductor integrated capacitor of claim 3, wherein said oxidized dielectric layer is oxidized TaO2.

* * * * *